United States Patent
Hidaka

(10) Patent No.: US 6,885,045 B2
(45) Date of Patent: Apr. 26, 2005

(54) LAYOUT STRUCTURE OF MULTIPLEXER CELLS

(75) Inventor: Itsuo Hidaka, Kanagawa (JP)

(73) Assignee: NEC Electronics Corporation (JP)

(*) Notice: Subject to any disclaimer, the term of this patent is extended or adjusted under 35 U.S.C. 154(b) by 0 days.

(21) Appl. No.: 10/784,728

(22) Filed: Feb. 23, 2004

(65) Prior Publication Data

US 2004/0169201 A1 Sep. 2, 2004

(30) Foreign Application Priority Data

Feb. 27, 2003 (JP) ........................................ 2003-050968

(51) Int. Cl.[7] .............................................. H01L 29/73
(52) U.S. Cl. ...................... 257/206; 257/208; 257/210; 257/211; 257/369; 257/371
(58) Field of Search ................................ 257/206, 208, 257/210, 211, 369, 371

(56) References Cited

U.S. PATENT DOCUMENTS

| | | | | |
|---|---|---|---|---|
| 5,377,136 A | * | 12/1994 | Nishio et al. | ................. 365/63 |
| 5,483,083 A | * | 1/1996 | Meguro et al. | ................. 257/69 |
| 5,635,737 A | * | 6/1997 | Yin | ............................ 257/204 |
| 5,930,163 A | * | 7/1999 | Hara et al. | ................... 365/154 |
| 6,307,234 B1 | * | 10/2001 | Ito et al. | ..................... 257/371 |
| 6,710,371 B2 | * | 3/2004 | Kitahara et al. | .............. 257/69 |

FOREIGN PATENT DOCUMENTS

| | | | |
|---|---|---|---|
| JP | 05-251671 | 9/1993 | ......... H01L/27/118 |
| JP | 2002-141477 | 5/2002 | ........... H01L/27/10 |

* cited by examiner

Primary Examiner—Richard Elms
Assistant Examiner—Douglas Menz
(74) Attorney, Agent, or Firm—Hayes Soloway P.C.

(57) ABSTRACT

A multiplexer cell layout structure is a layout structure of primitive cells where cell arrays composed of P-channel transistors and N-channel transistors are arranged in two upper and lower rows. And, a plurality of transistors of transfer gates are arranged on the upper side and lower side of the cell arrays, an output terminal of the plurality of arranged transistors is connected up and down by Metal wiring across between the upper and lower cell arrays. Thus, a multiplexer cell layout structure which increases wiring tracks of two-layer metal wiring for a one-chip layout held by a 4-input multiplexer inverter can be obtained.

10 Claims, 13 Drawing Sheets

LAYOUT STRUCTURE OF MULTIPLEXER CELLS

BACKGROUND OF THE INVENTION

1. Technical Field of the Invention

The present invention relates to a layout structure of multiplexer cells, and in particular, it relates to a multiplexer cell layout structure having primitive cells wherein cell arrays composed of P-channel transistors and N-channel transistors are arranged in two upper and lower rows.

2. Description of the Related Art

In recent years, semiconductor integrated circuits (hereinafter, referred to as LSIs) designed as ASICs are well known. Of these, LSIs having a layout structure of primitive cells wherein a cell array composed of P-channel transistors and N-channel transistors is arranged in a single horizontal row are known.

Such LSIs are disclosed in Japanese Published Unexamined Patent Application No. 2002-141477 and Japanese Published Unexamined Patent Application No. H05-251671, for example.

In general, it is widely known that small-scale layouts block drawn at a transistor level utilized in layout design of one chip are called primitive cells (or primitive blocks).

Primitive cells have logical functions such as an inverter, a buffer, a NAND, a NOR, a multiplexer, and a flip-flop. And, the inverter is referred to as an inverter cell, the buffer is referred to as a buffer cell, the NAND is referred to as a NAND cell, the NOR is referred to as a NOR, the multiplexer is referred to as a multiplexer cell, and the flip-flop is referred to as a flip-flop cell.

In addition, a primitive cell has a layout form wherein a P-channel transistor region and an N-channel transistor region are adjacently arranged up and down (or right and left) and a plurality of P-channel transistors and a plurality of N-channel transistors are lined up in the lateral direction (or the longitudinal direction). In a layout structure of multiplexer primitive cells as well, the primitive cell is composed of a cell array wherein P-channel transistors and N-channel transistors are adjacent and lined up in a row.

FIG. 1 is a circuit diagram for a layout of a conventional layout structure using a 4-input multiplexer-inverter circuit.

A conventional multiplexer circuit layout structure has primitive cells as described above. And, the layout structure has a cell layout structure wherein, on multiplexer circuits (401, 402, 403, and 404) having a plurality of transfer gate outputs or inverter outputs, or both thereof, transfer gate transistors (409-1, 409-2, 409-3, and 409-4) are arranged in a single cell array 406, and an output terminal (N01) of the arranged transistors is connected within the single cell array 406 by use of a polysilicon layer, 1-layer metal wiring, and 2-layer metal wiring.

Furthermore, the conventional multiplexer circuit layout structure employs a cell layout structure wherein a multiplexer decoding circuit 405 is arranged on the right side of the output terminal (N01), internal wiring of the decode circuit is connected within the single cell array 406 by use of a polysilicon layer, 1-layer metal wiring, and 2-layer metal wiring, and signal wiring to control the transistor gate circuit transistor outputs is connected within the single cell array 406 by use of a polysilicon layer, 1-layer metal wiring, and 2-layer metal wiring right and left.

In FIG. 2, wiring tracks 701 of 2-layer metal wiring of the prior-art 4-input multiplexer-inverter as shown in FIG. 1 are shown. In the drawing, "x" shows wiring tracks of 2-layer metal wiring 702 used by cells, which means that the tracks cannot be used as wiring tracks of 2-layer metal wiring of one chip.

In addition, as another prior art, a circuit diagram of a 2-staged transfer gate-type 4-input multiplexer is shown in FIG. 3. In a 2-staged transfer gate-type 4-input multiplexer 900, first-stage transfer gates are composed of a first-stage transfer gate 909-1 to receive a signal from an input terminal H01, a first-stage transfer gate 909-2 to receive a signal from an input terminal H02, a first-stage transfer gate 909-3 to receive a signal from an input terminal H03, and a first-stage transfer gate 909-4 to receive a signal from an input terminal H04.

Furthermore, in the 2-staged transfer gate-type 4-input multiplexer 900, second-stage transfer gates are composed of a second-stage transfer gate 909-5 to receive an output from the first-stage transfer gate 909-1 and an output from the transfer gate 909-2 and a second-stage transfer gate 909-6 to receive an output from the first-stage transfer gate 909-3 and an output from the transfer gate 909-4.

Moreover, an output terminal (N01) to receive an output from the second-stage transfer gate 909-5 and an output from the second-stage transfer gate 909-6 is provided.

However, if transistors of a prior-art multiplexer-inverter circuit are arranged in a single row in the lateral direction, a transfer gate circuit part (401, 402, 403, and 404) inside the cells requires, as shown in FIG. 1, a total of five lateral wiring tracks, four for control signals and one for outputting, for wiring inside the cells, and a 2-4 decoder circuit part requires eight lateral wiring tracks for wiring inside the cells.

On the other hand, since lateral wiring tracks of a polysilicon layer and 1-layer metal wiring of a prior-art cell layout structure are reduced by terminals and power supply wiring, etc., usually only approximately four exist in total. Accordingly, for the rest of the wiring, 2-layer metal wiring whose principal axis is in the longitudinal direction is wired in the lateral direction.

This lateral 2-layer metal wiring consequently intersects with the vertical axis, which is a principal axis of a 2-layer metal wiring channel of one chip, and approximately 30 wiring tracks 702 of the 2-layer metal wiring are used. Therefore, 2-layer metal wiring tracks of one chip are greatly reduced, and wireability of one chip greatly lowers.

SUMMARY OF THE INVENTION

It is an object of the present invention to provide a layout structure of multiplexer cells which can increase wiring tracks of 2-layer metal wiring for a one-chip layout included in a 4-input multiplexer-inverter.

A layout structure of multiplexer cells according to the present invention comprises: cell arrays composed of P-channel transistors and N-channel transistors which are arranged in two upper and lower rows; and a wiring layer composed of a plurality of layers for connecting said cell arrays. Each of said cell arrays comprises a plurality of transfer gates. A plurality of transistors of said transfer gates are arranged in upper one of said cell arrays and lower one of said cell arrays, and an output terminal of the plurality of arranged transistors is connected across between said upper and lower cell arrays by 2-layer metal wiring of said wiring layer.

Moreover, in the multiplexer cell layout structure according to the present invention, it is also possible to have a decoding circuit which has transistors arranged on the upper side and lower side of said cell arrays.

Also, an internal wiring of said decoding circuit may be connected across between the upper and lower cell arrays by at least a wiring layer including a polysilicon layer out of said wiring layer. A control signal wiring for controlling transistor output of said transfer gate circuit may be connected across between the upper and lower cell arrays by at least a wiring layer including a polysilicon layer out of said wiring layer.

Furthermore, in the multiplexer cell layout structure according to the present invention, it is also possible to form the multiplexer cells as a 4-input multiplexer-inverter.

DETAILED DESCRIPTION OF THE PREFERRED EMBODIMENTS

The present invention is characterized in that, in a layout structure of primitive cells wherein cell arrays composed of P-channel transistors and N-channel transistors are arranged in two upper and lower rows, a plurality of transistors of transfer gates are arranged on the upper side and lower side of the cell arrays, an output terminal of the plurality of arranged transistors is connected up and down across between the upper and lower cell arrays by 2-layer metal wiring.

By employing the present cell layout structure, provided is an effect such that the wiring length at the transfer gate output side is shortened to reduce a circuit delay, and provided is a function such that wiring tracks of 2-layer metal wiring used by the cells inside the cells are reduced to increase wiring tracks of 2-layer metal wiring for a one-chip layout. Accordingly, an effect such as an improvement in the operational speed of the multiplexer circuit and an improvement in wireability can be obtained.

Hereinafter, an embodiment of a layout structure of multiplexer cells of the present invention will be described with reference to the drawings.

Figure 4:
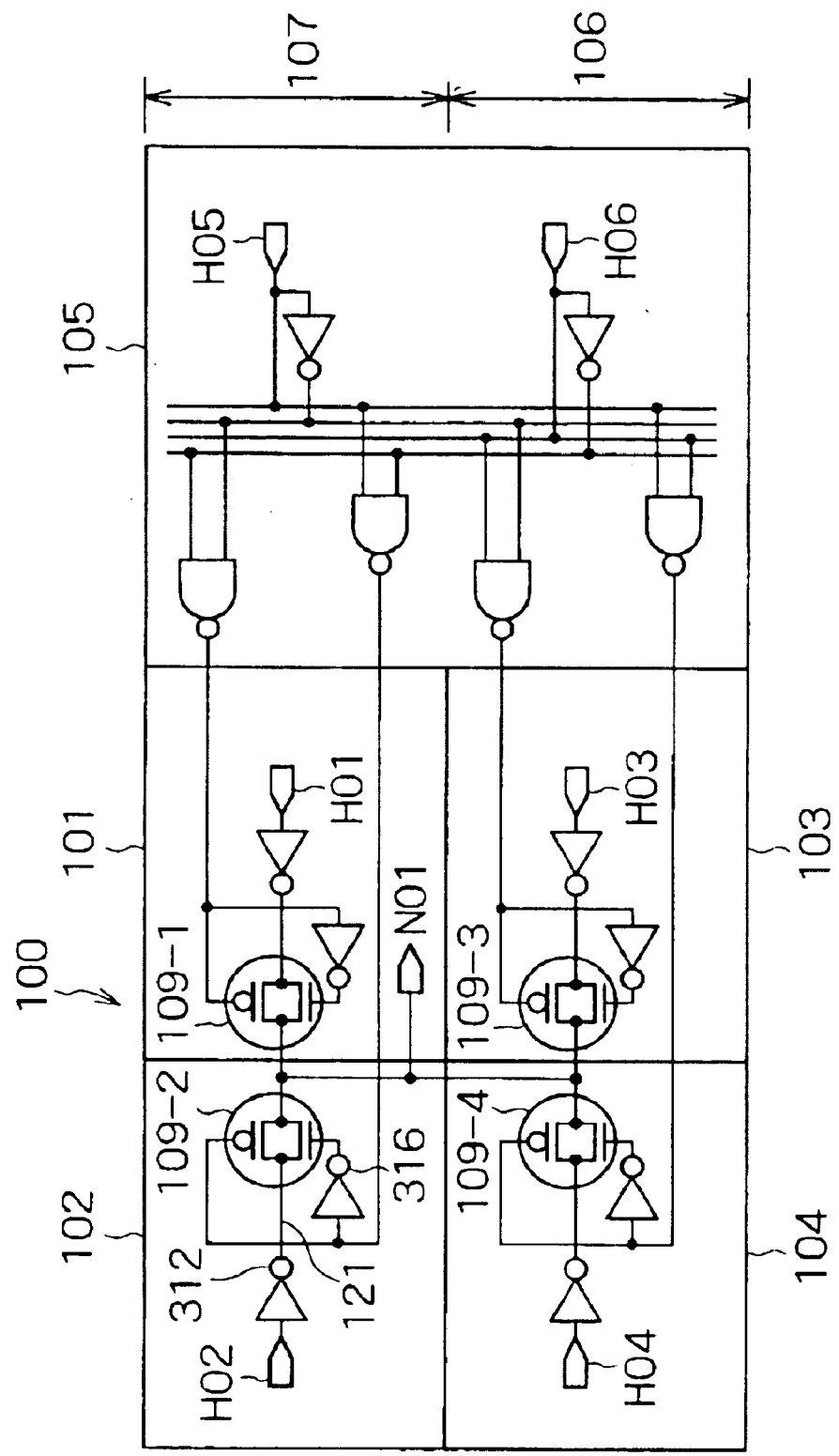
FIG. 4 is a circuit diagram for a layout of a 4-input multiplexer-inverter of multiplexer cells according to a first embodiment of the present invention.
Figure 5:
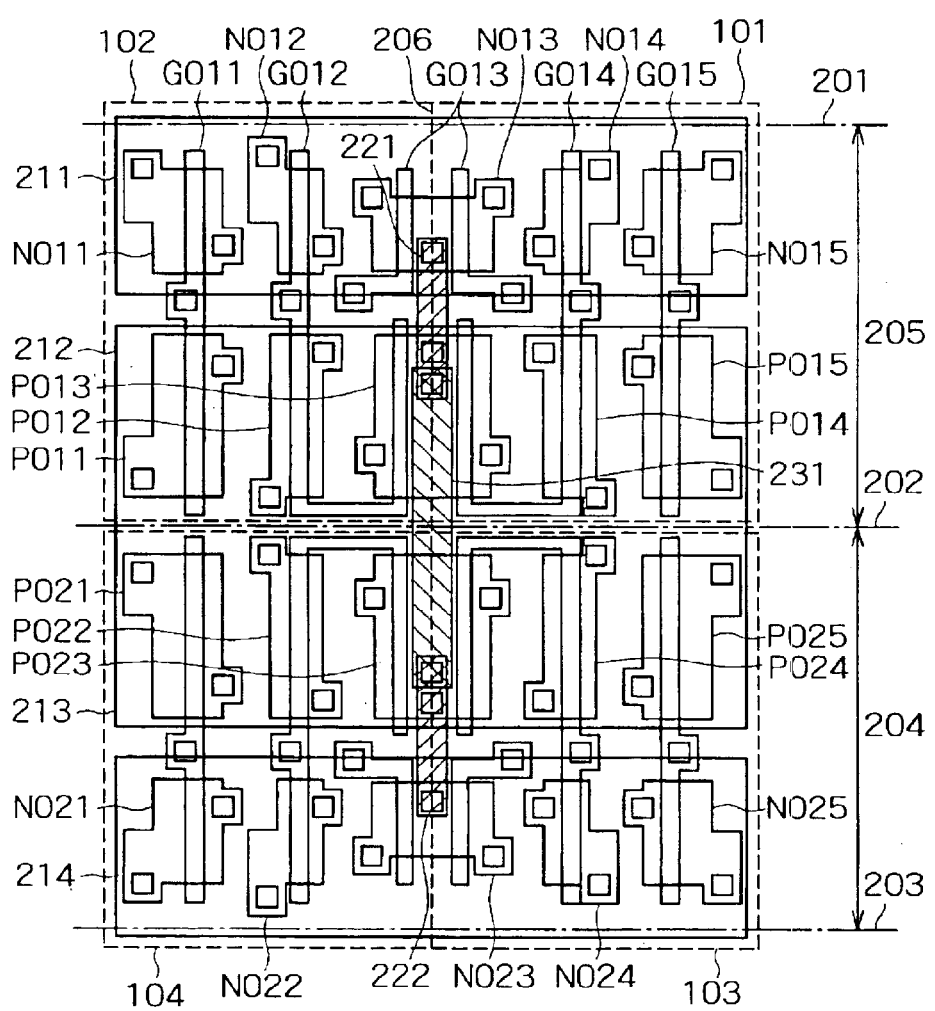
FIG. 5 is a plane configuration diagram of a 4-input multiplexer-inverter of multiplexer cells according to a first embodiment of the present invention.
Figure 9:
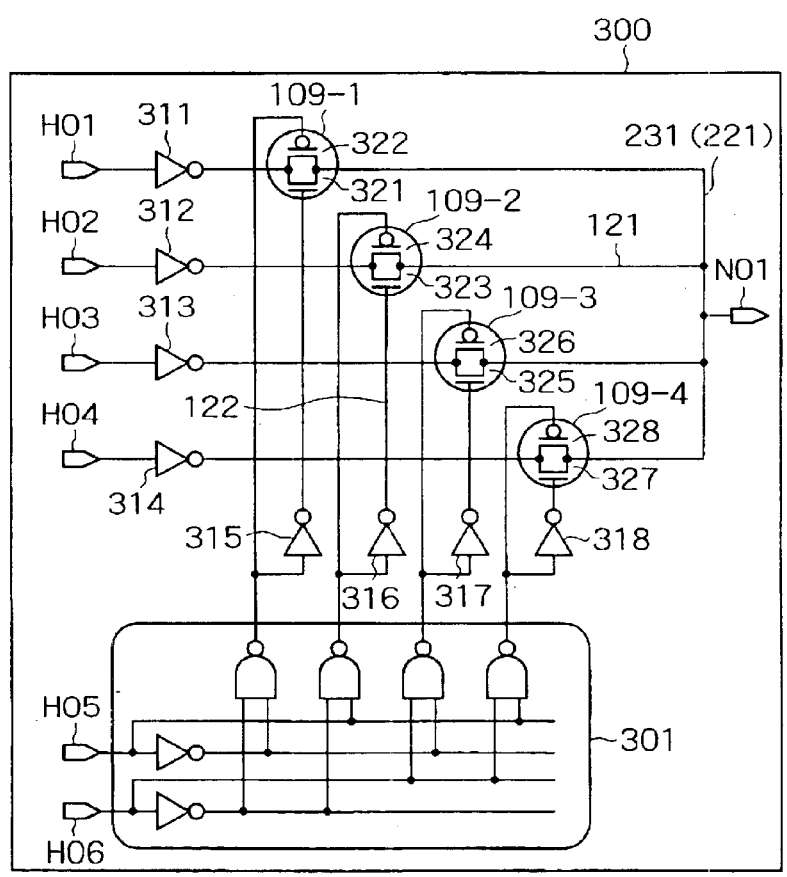
FIG. 9 is a circuit diagram of a 4-input multiplexer-inverter of multiplexer cells according to a first embodiment of the present invention.
Figure 10:
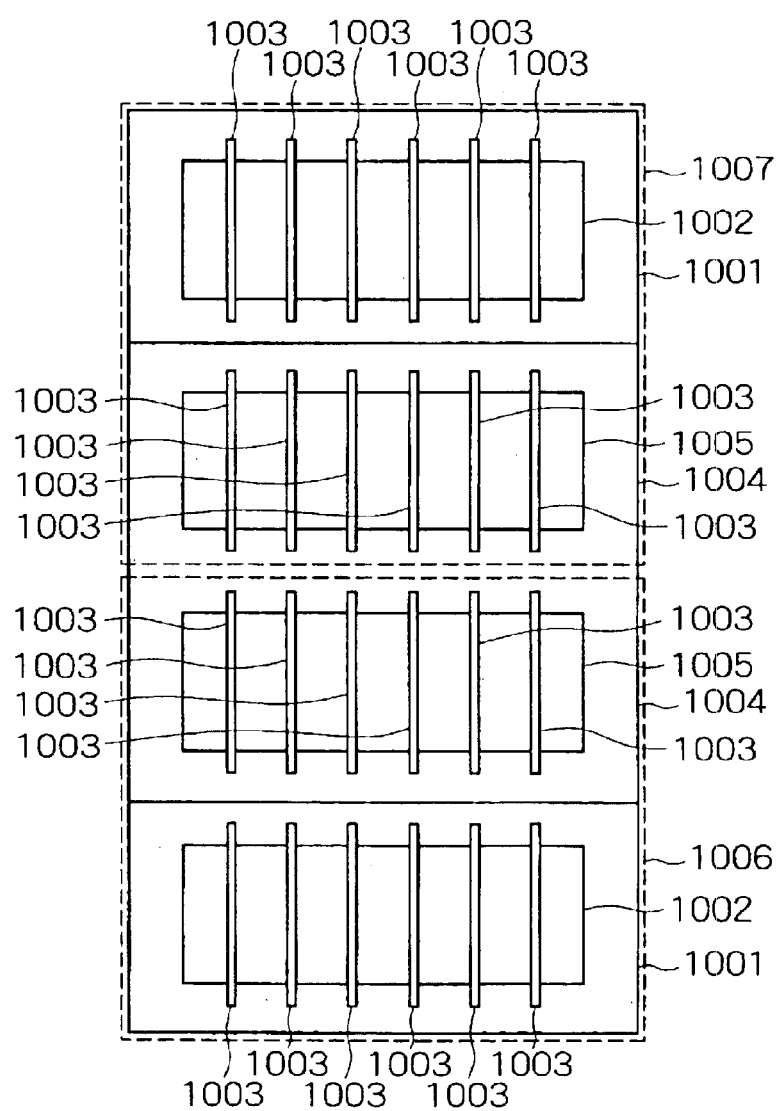
FIG. 10 is a view showing a cell array construction of multiplexer cells according to an embodiment of the present invention.

FIG. 4 is a circuit diagram for a layout of a 4-input multiplexer-inverter according to the present invention. FIG. 5, FIG. 6, FIG. 7, and FIG. 8 are plane configuration diagrams of the 4-input multiplexer-inverter as shown in FIG. 4. FIG. 9 is a circuit diagram of a 4-input multiplexer-inverter. FIG. 10 shows a constructional view of cell arrays as shown in FIG. 5.

A multiplexer-inverter has inverted multiplexer output values and the logic is the same except for the output inversion, and the logic becomes equivalent to that of a multiplexer if an inverter is added to a final-stage output from the multiplexer-inverter.

A height of one cell array is called a single height, and a height of two cell arrays is called a double height. An example wherein the devised multiplexer cell layout structure has been applied to 4-input multiplexer-inverter cells will be described.

Referring to FIG. 4, in a layout structure 100 of 4-input multiplexer-inverter cells according to a first embodiment of the present invention, four output circuits (101, 102, 103, and 104) including four transfer gates (109-1, 109-2, 109-3, and 109-4) are arranged in right-and-left symmetry and are arranged in up-and-down symmetry. Namely, two (109-1 and 109-2) out of the four transfer gates (109-1, 109-2, 109-3, and 109-4) are arranged in right-and-left symmetry, furthermore, two (109-1 and 109-2) are arranged in up-and-down symmetry so as to provide two transfer gates (109-3 and 109-4), thus the four are arranged.

The first embodiment of the present invention further provides a cell layout structure wherein an output terminal (N01) of transfer gates is connected up and down across between cell arrays of a cell array 107 and a cell array 106 as wiring 108 of 2-layer metal wiring.

Next, the first embodiment of the present invention will be described with reference to FIG. 5, which shows a concrete arrangement. FIG. 5 is a schematic plane configuration diagram of the 4-input multiplexer-inverter cells as shown in FIG. 4. Referring to FIG. 5, a layout structure of primitive cells of 4-input multiplexer-inverter cells according to the first embodiment of the present invention is a structure wherein a cell array 211 composed of N-channel transistors (N011 through N015) and a cell array 212 composed of P-channel transistors (P011 through P015) are arranged in two upper and lower rows.

Furthermore, in a primitive cell layout structure of 4-input multiplexer-inverter cells according to the first embodiment of the present invention, the N-channel transistor N011 and N-channel transistor N015 and the N-channel transistor N012 and N-channel transistor N014 are arranged in right-and-left symmetry with respect to the axis of a segment 206, respectively. In addition, the N-channel transistor N013 is arranged in right-and-left symmetry itself with respect to the axis of the segment 206.

The P-channel transistors also have a similar arrangement relationship, and in a primitive cell layout structure of 4-input multiplexer-inverter cells according to the first embodiment of the present invention, the P-channel transistor P011 and P-channel transistor P015 and the P-channel transistor P012 and P-channel transistor P014 are arranged in right-and-left symmetry with respect to the axis of the segment 206, respectively. In addition, the P-channel transistor P013 is arranged in right-and-left symmetry itself with respect to the axis of the segment 206.

Namely, a primitive cell layout structure of 4-input multiplexer-inverter cells comprises a structure wherein a cell array 211 composed of N-channel transistors (N011 through N015) and a cell array 212 composed of P-channel transistors (P011 through P015) arranged in right-and-left symmetry in a cell array 205 region are arranged in two upper and lower rows.

And, furthermore, a layout structure of primitive cells is a double-height type wherein the cell array 211 and cell array 212 are arranged in up-and-down symmetry with respect to the axis of a segment 202 as the cell array 214 and cell array 213 in a cell array 204 region.

And, in a primitive cell layout structure of 4-input multiplexer-inverter cells according to the first embodiment of the present invention, a transfer gate output terminal (N01) of FIG. 4 is wired and connected across between cell arrays of the cell array 205 and cell array 204 as wiring 231 of 2-layer metal wiring.

As shown in FIG. 4, a decode circuit 105 is constructed by a first decode circuit 106 and a second decode circuit 107. In FIG. 5, the first decode circuit 106 may be arranged on the upper side of the upper cell array of the primitive cell, and the second decode circuit 107 may be arranged on the lower side of the lower cell array of the primitive cell. In this arrangement, an internal wiring of said decoding circuit is connected across between the upper and lower cell arrays by at least a wiring layer including a polysilicon layer out of said wiring layer, and a control signal wiring for controlling transistor output of said transfer gate circuit is connected across between the upper and lower cell arrays by at least a wiring layer including a polysilicon layer out of said wiring layer. On the contrary to this, an internal wiring of said decoding circuit may be connected by at least one of 1-layer metal wiring and 2-layer metal wiring.

Moreover, reference symbols corresponding to the reference symbols given to the transistors are given to gate electrodes formed of polysilicon of the N-channel transistors (N011 through N015 and N021 through N025) and P-channel transistors (P011 through P015 and P021 through P025). For example, in a case of the N-channel transistor (N011), a reference symbol is given to the gate electrode (G011).

Figure 6:
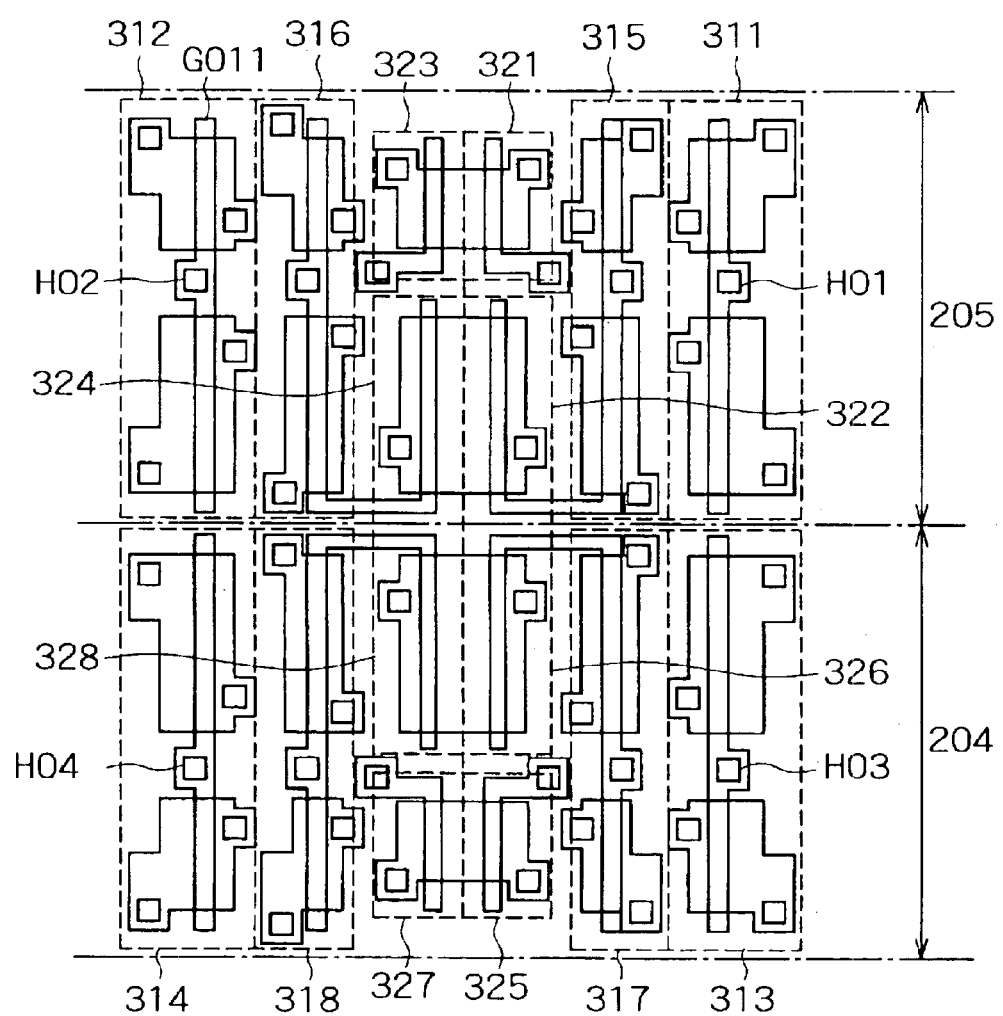
FIG. 6 is a view showing a plane configuration of cell arrays of multiplexer cells according to an embodiment of the present invention.

Next, FIG. 6 shows a plane configuration corresponding to circuit elements of 4-input multiplexer-inverter cells according to the first embodiment of the present invention as shown in FIG. 9.

Circuit elements with reference symbols as shown in FIG. 9 are arranged in a manner corresponding to the cell array 211 composed of the N-channel transistors (N011 through N015), cell array 212 composed of the P-channel transistors (P011 through P015), cell array 214 composed of N-channel transistors (N021 through N025) arranged in right-and-left symmetry in a cell array 204 region, and cell array 213 composed of P-channel transistors (P021 through P025), which are shown in FIG. 5.

Description will be given of the output circuit 102, for example. An inverter 312 of the output circuit 102 is assigned to the N-channel transistor N011 and P-channel transistor P011. Furthermore, an inverter 316 is assigned to the N-channel transistor N012 and P-channel transistor P012. Furthermore, an N-channel transistor 323 of a transfer gate (109-2) is assigned to a left transistor of the N-channel transistor N013, and a P-channel transistor 324 is assigned to a left transistor of the P-channel transistor P013.

Similarly, description will be given of the output circuit 101. An inverter 311 of the output circuit 101 is assigned to the N-channel transistor N015 and P-channel transistor P015. Furthermore, an inverter 315 is assigned to the N-channel transistor N104 and P-channel transistor P014. Furthermore, an N-channel transistor 321 of a transfer gate (109-1) is assigned to a right transistor of the N-channel transistor N013, and a P-channel transistor 322 is assigned to a right transistor of the P-channel transistor P013.

Similarly, the output circuit 103 is arranged in a manner where the output circuit 101 is symmetrically folded back with respect to the line 202, the output circuit 104 is arranged in a manner where the output circuit 101 is folded back, and corresponding transistors are assigned thereto, respectively.

Namely, an inverter 314 of the output circuit 104 is assigned to the N-channel transistor N021 and P-channel transistor P021. Furthermore, an inverter 318 is assigned to the N-channel transistor N022 and P-channel transistor P022. Furthermore, an N-channel transistor 327 of a transfer gate (109-4) is assigned to a left transistor of the N-channel transistor N023, and a P-channel transistor 328 is assigned to a left transistor of the P-channel transistor P023.

An inverter 313 of the output circuit 103 is assigned to the N-channel transistor N025 and P-channel transistor P025. Furthermore, an inverter 317 is assigned to the N-channel transistor N024 and P-channel transistor P024. Furthermore, an N-channel transistor 325 of a transfer gate (109-3) is assigned to a right transistor of the N-channel transistor N023, and a P-channel transistor 326 is assigned to a right transistor of the P-channel transistor P023.

Figure 7:
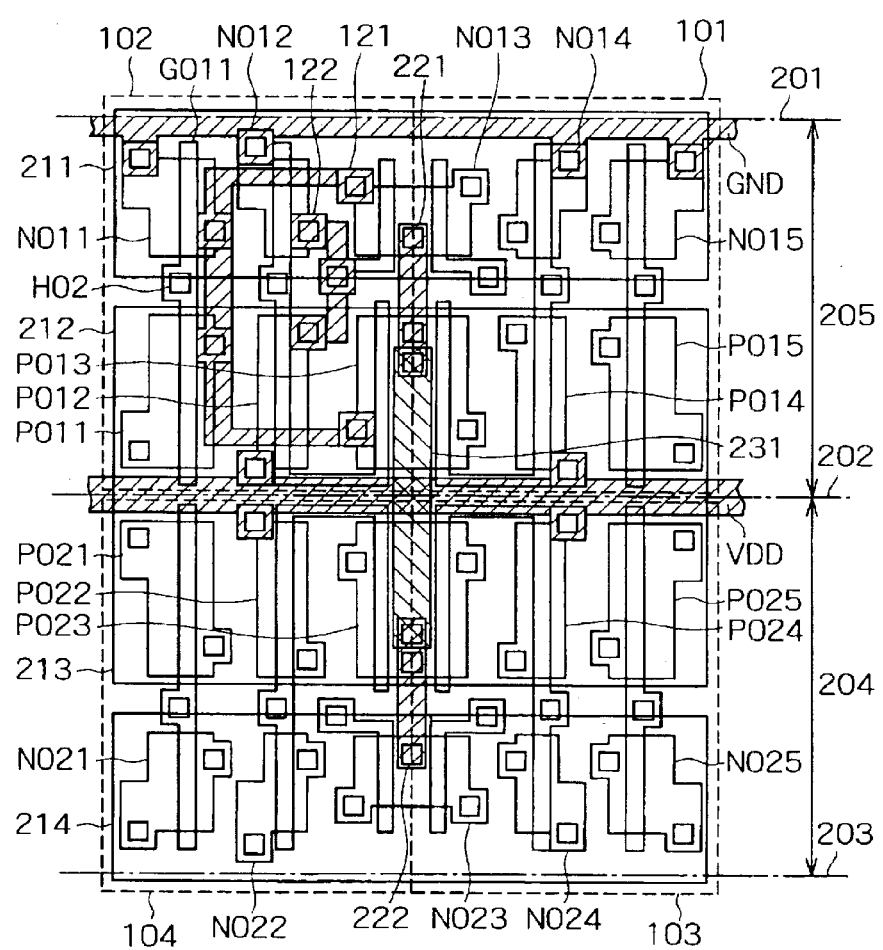
FIG. 7 is a plan view showing a wiring construction of cell arrays of multiplexer cells according to an embodiment of the present invention.
Figure 8:
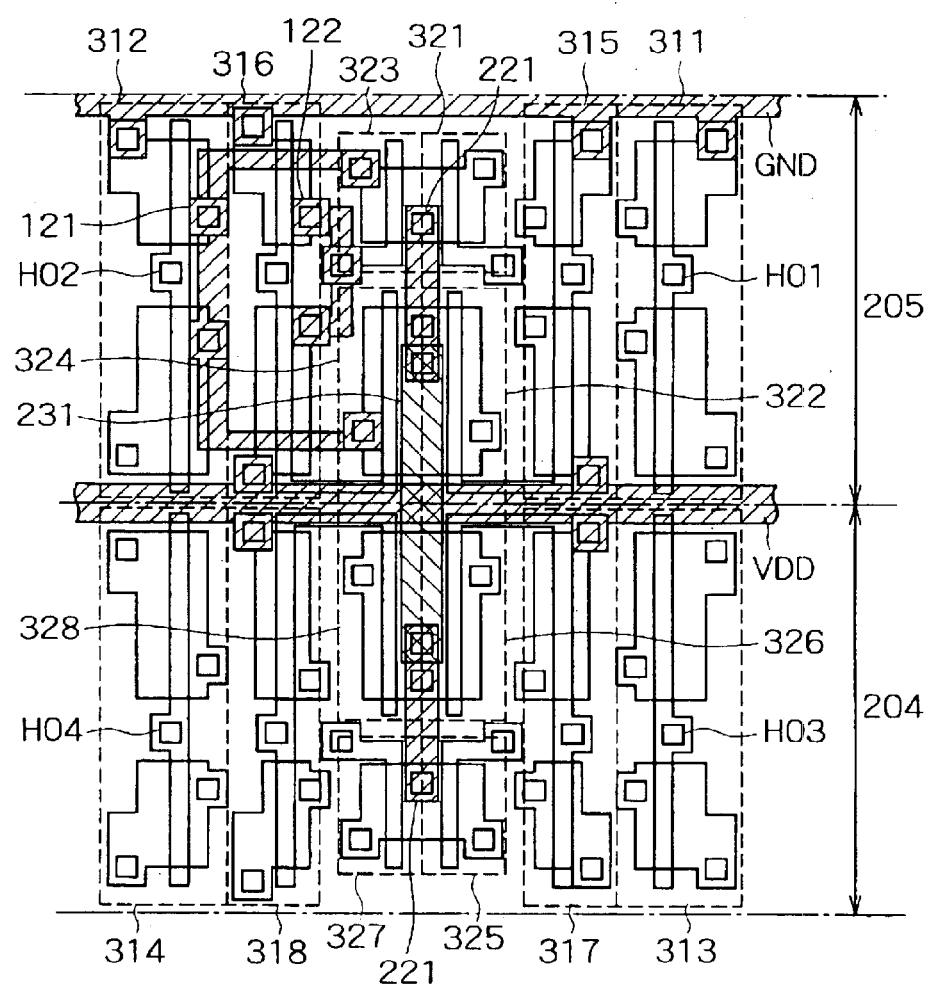
FIG. 8 is a plan view showing another wiring construction of cell arrays of multiplexer cells according to an embodiment of the present invention.

FIG. 7 and FIG. 8 are further detailed plan views of a primitive cell layout structure of 4-input multiplexer-inverter cells according to the first embodiment of the present invention, which show a wiring structure from the input terminal H02 to output terminal N01 in terms of the output circuit 102 as a representative example.

Referring to FIG. 7 and FIG. 8, description will be made of a structure of 1-layer metal wiring and 2-layer metal wiring of primitive cells of 4-input multiplexer-inverter cells according to the first embodiment of the present invention.

As wiring 121 of a structure of primitive cells of 4-input multiplexer-inverter cells according to the first embodiment of the present invention as shown in FIG. 4, respective source of the transistor N011 and transistor P011 of the inverter 312 as shown in FIG. 6, FIG. 7, and FIG. 8 are connected, an N-channel transistor 323 of a transfer gate (109-2) is assigned to a left transistor of the N-channel transistor N013, a P-channel transistor 324 is assigned to a left transistor of the P-channel transistor P013, and these are connected to respective drains of the N-channel transistor 323 and P-channel transistor 324.

And, respective sources of the N-channel transistor 323 and P-channel transistor 324 are connected and arranged as output wiring 231. The output wiring 231 is arranged between the cell arrays across the cell array 205 and cell array 204 as shown in FIG. 7 and FIG. 8.

In addition, a cell array construction of 4-input multiplexer-inverter cells of a double-height type is shown as a schematic plan view in FIG. 10. As shown in FIG. 10, as a double height-type 4-input multiplexer-inverter, a cell array 1 (1007) arranged on the upper side and a cell array 2

(1006) arranged on the lower side are composed of a P-channel well layer 1001, an N-channel diffusion layer 1002, a poly-gate layer 1003, an N-channel well layer 1004, and a P-channel diffusion layer 1005. The N-channel well layer 1004 located in the upper cell array 1 (1007) is in contact with the N-channel well layer 1004 located in the lower cell array 1 (1006).

Figure 11:
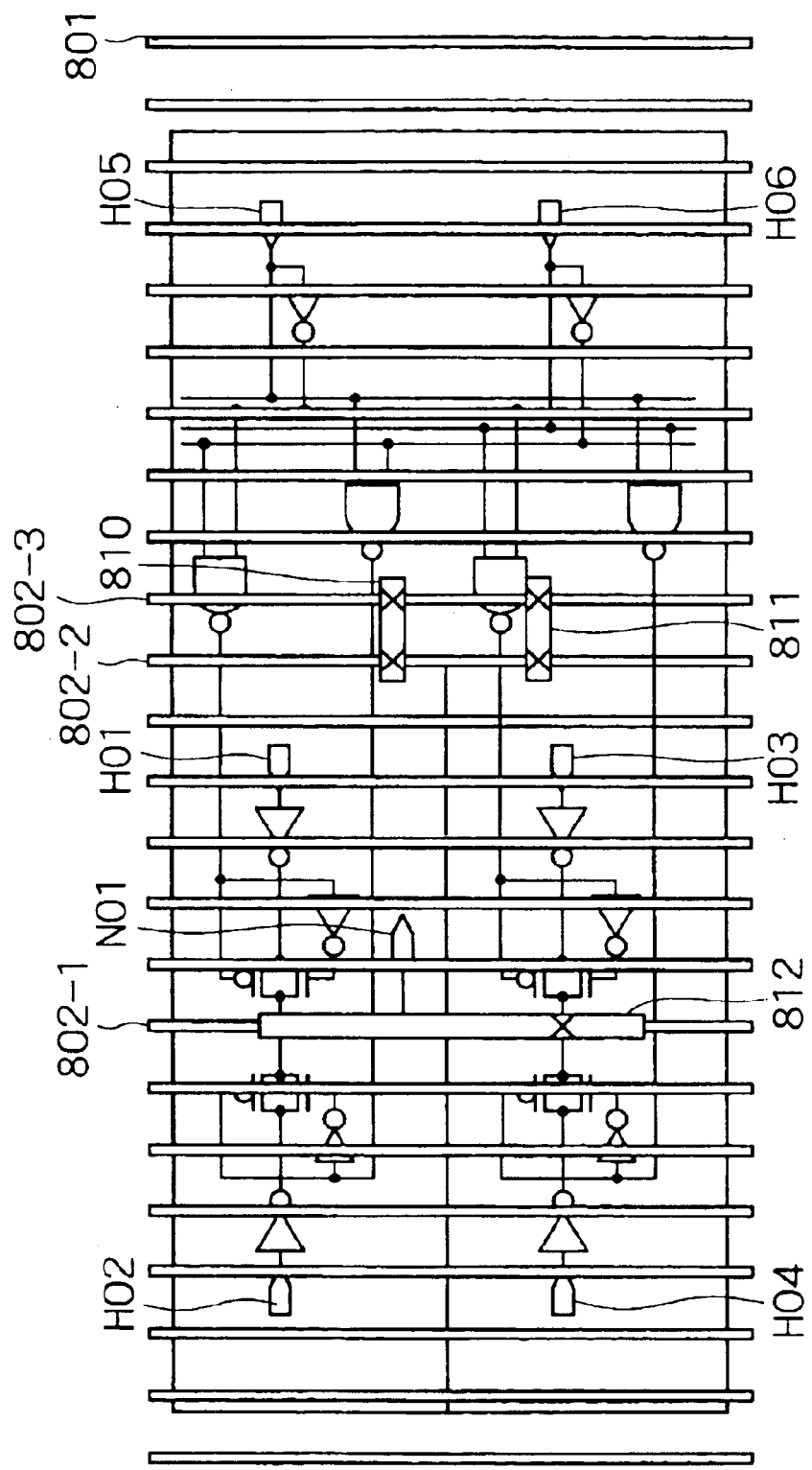
FIG. 11 is a wiring track diagram of 2-layer metal wiring of a 4-input multiplexer-inverter according to an embodiment of the present invention.

Wiring tracks 802 of 2-layer metal wiring of the 4-input multiplexer-inverter according to an embodiment of the present invention is shown in FIG. 11. In the drawing, "x" (810, 811, and 812) show wiring tracks (802-1, 802-2, and 802-3) of 2-layer metal wiring used by cells, which means that the tracks cannot be used as wiring tracks of 2-layer metal wiring of one chip.

Namely, according to the present invention, in the wiring part 231 between transistor outputs of the output circuits (101, 102, 103, and 104), wiring to be connected results in the longitudinal direction of the 2-layer metal wiring, which is an identical direction to the principal axis of 2-layer metal wiring of one chip, and uses one 2-layer metal wiring track (802-1).

2-layer metal wiring of the other internal circuit part uses two tracks (802-2 and 802-3), wiring tracks of 2-layer metal wiring used in the cells are three in total.

Figure 1:
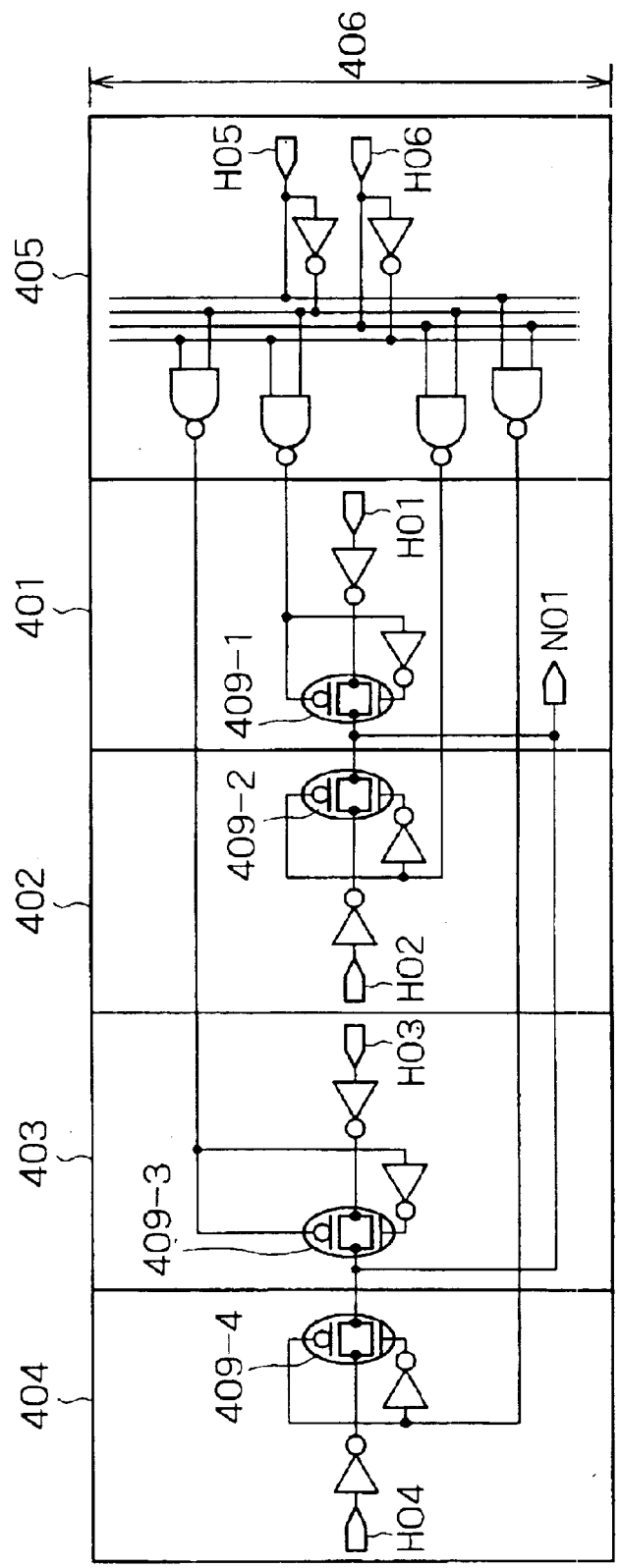
FIG. 1 is a circuit diagram for a layout of a conventional layout structure using a 4-input multiplexer-inverter circuit.
Figure 2:
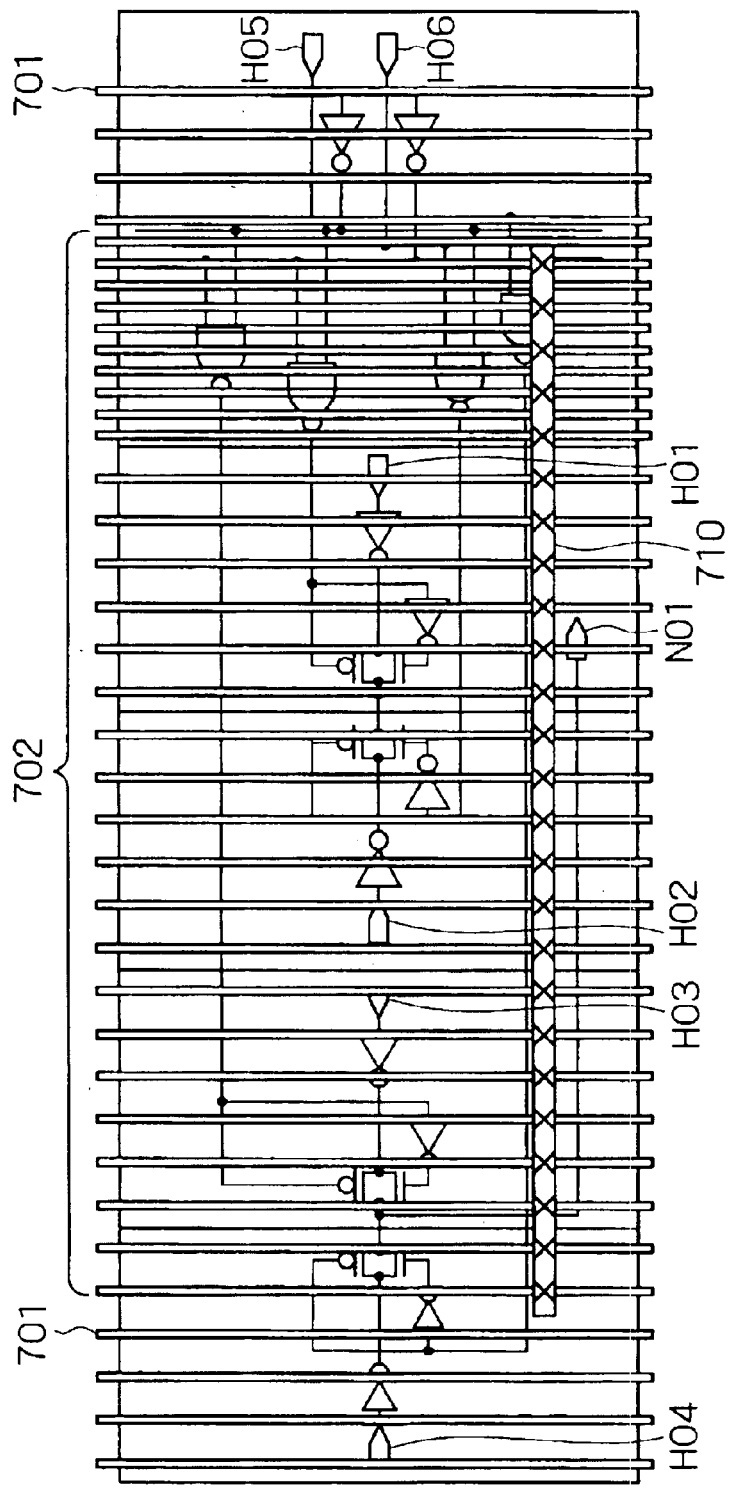
FIG. 2 is a wiring track diagram of 2-layer metal wiring of a conventional 4-input multiplexer-inverter.

On the other hand, 2-layer metal wiring tracks of a prior-art 4-input multiplexer-inverter are shown in FIG. 2. In the drawing, "x" shows wiring tracks of 2-layer metal wiring used by cells, which means that the tracks cannot be used as wiring tracks of 2-layer metal wiring of one chip. In the prior-art multiplexer layout, since it is necessary to provide one or more wiring tracks of 2-layer metal wiring in the lateral direction, approximately 30 2-layer metal wiring tracks are used.

Consequently, as a result of a reduction in the number of used wiring tracks of 2-layer metal wiring from approximately 30 to 3, available wiring tracks of one chip are increased, and wireabiltiy is greatly improved. Thereby, in terms of wiring inside the cells, short wiring is possible, and accordingly, wiring delay inside the cells is reduced.

Figure 3:
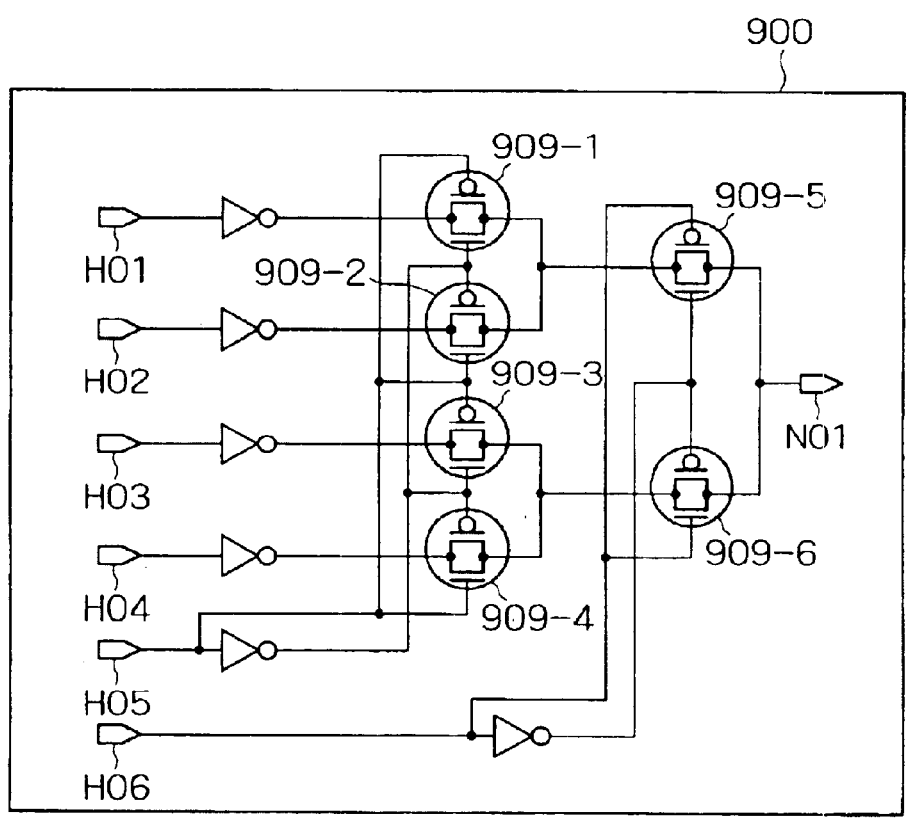
FIG. 3 shows another conventional 4-input multiplexer with 2-staged transfer gates.

Concretely, in terms of the general 2-staged transfer gate-type 4-input multiplexer cells shown in the circuit diagram of FIG. 3, a speed improvement by 44% (0.0820 nS to 0.0460 nS, H01 Rise, N01 Fall, Trf 0.01 ns, CB12M, Typical condition) was recognized.

When the present cells were applied to a barrel shifter circuit of a CPU core (ARM9), a result such that the speed is improved by 10% (0.653[ns]) was obtained in logic synthesis.

Figure 12:
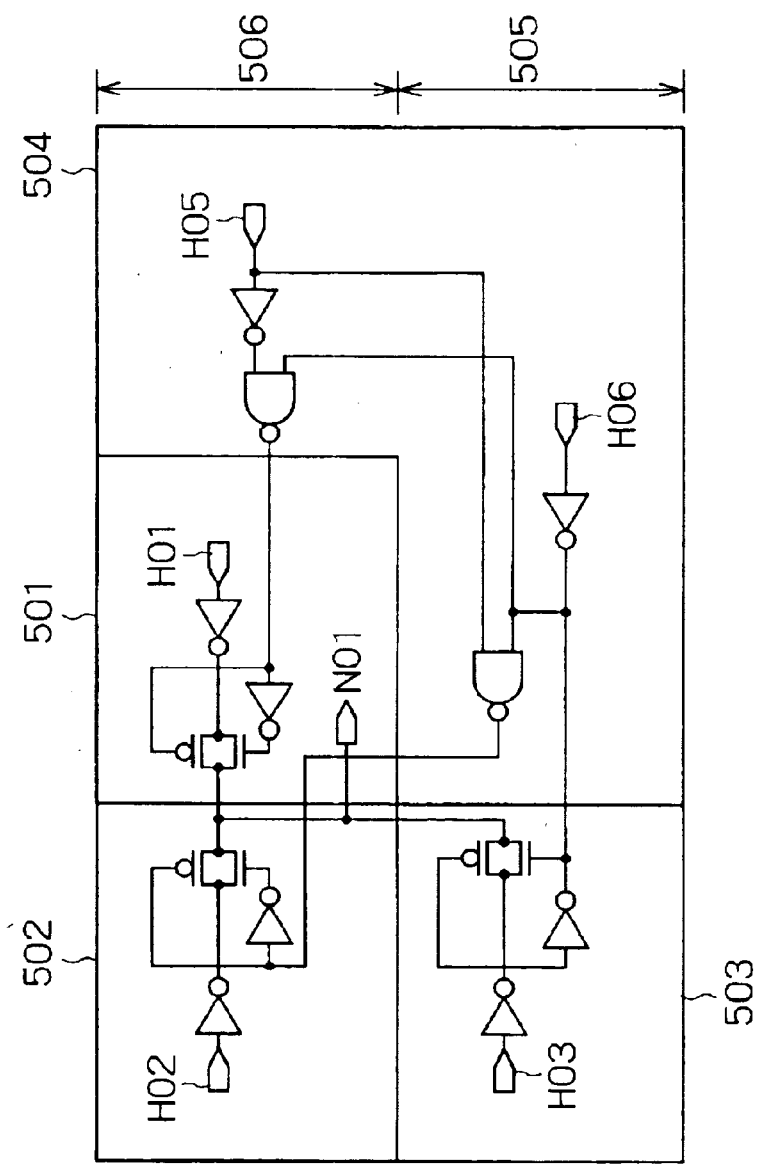
FIG. 12 is a circuit diagram for a layout of a 3-input multiplexer-inverter of multiplexer cells according to a second embodiment of the present invention.

Next, as a layout structure of 4-input multiplexer-inverter cells according to a second embodiment of the present invention, a circuit diagram for a layout of a 3-input multiplexer-inverter is shown in FIG. 12. In the layout structure of 4-input multiplexer-inverter cells according to the second embodiment of the present invention, output terminals of the transfer gates which exist one each in output circuits 1 (501), 2 (502), and 3 (503) are connected by a terminal 507 wired and connected in the up-and-down direction across between cell arrays of a cell array 1 (505) and a cell array 2 (506).

Herein, as to a concrete plane configuration of a layout structure of 4-input multiplexer-inverter cells according to the second embodiment of the present invention, since this is identical to the layout structure of 4-input multiplexer-inverter cells according to the first embodiment of the present invention, detailed description thereof will be omitted.

Figure 13:
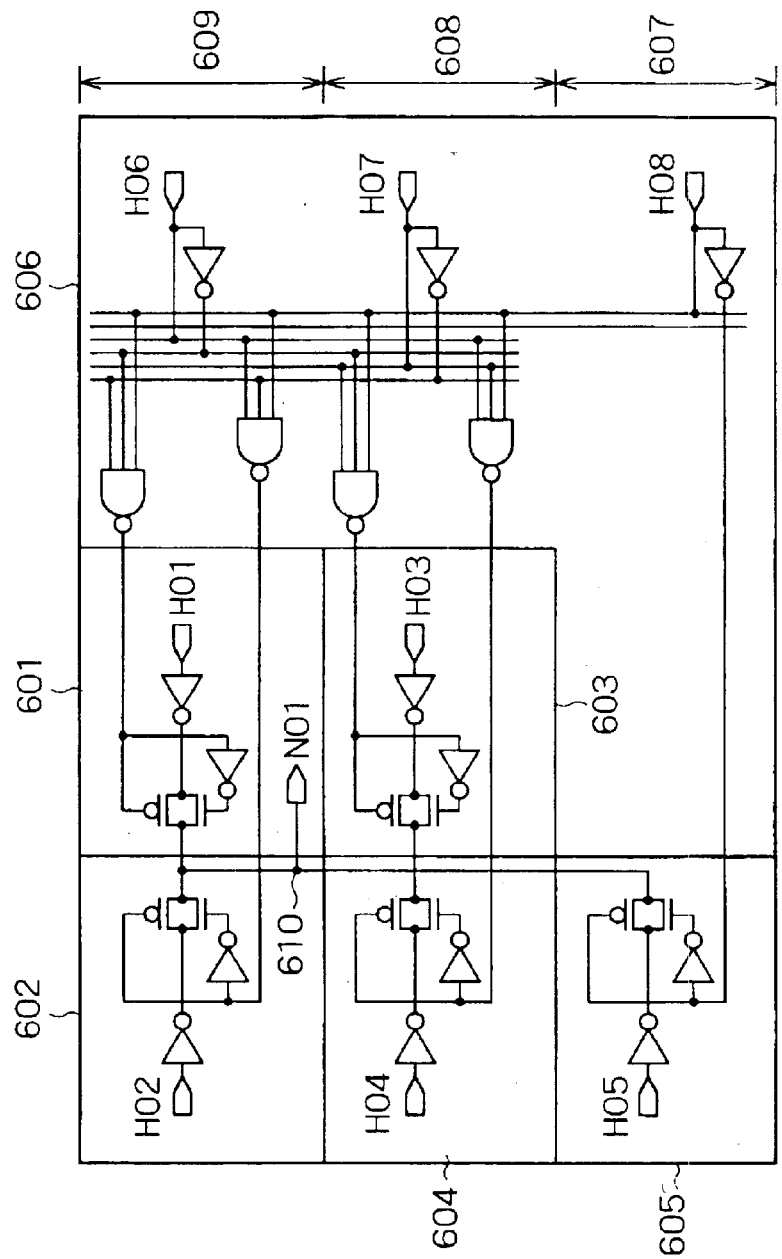
FIG. 13 is a circuit diagram for a layout of a 5-input multiplexer-inverter of multiplexer cells according to a third embodiment of the present invention.

Next, as a layout structure of 4-input multiplexer-inverter cells according to the third embodiment of the present invention, a circuit diagram for a layout of a 3-input multiplexer-inverter is shown in FIG. 12. A circuit diagram for a layout of a 5-input multiplexer-inverter whose cell arrays are three-staged is shown in FIG. 13.

In the layout structure of 4-input multiplexer-inverter cells according to a third embodiment of the present invention, output terminals of the transfer gates which exist one each in output circuits 1 (601), 2 (602), 3 (603), 4 (604), and 5 (605) are connected by a terminal 610 connected in the up-and-down direction across between cell arrays of a cell array 1 (607) and a cell array 2 (608), and a cell array 3 (609).

And, as to a concrete plane configuration of the layout structure of 4-input multiplexer-inverter cells according to the third embodiment of the present invention, since this is identical to the layout structure of 4-input multiplexer-inverter cells according to the first embodiment of the present invention, detailed description thereof will be omitted.

According to the present invention, in the wiring part between transistor outputs of the output circuits, wiring to be connected results in the longitudinal direction of the 2-layer metal wiring, which is an identical direction to the principal axis of 2-layer metal wiring of one chip, and uses one 2-layer metal wiring track. Since 2-layer metal wiring of the other internal circuit part uses two tracks, wiring tracks of 2-layer metal wiring used in the cells are three in total.

In the prior-art multiplexer layout, since it is necessary to provide one or more wiring tracks of 2-layer metal wiring in the lateral direction, approximately 30 2-layer metal wiring tracks are used. Consequently, since wiring tracks of 2-layer metal wiring used in cells are reduced from approximately 30 to 3 and 2-layer metal wiring tracks of one chip can be greatly secured, wireabiltiy of one chip is greatly improved. Wiring tracks of 2-layer metal wiring of a 4-input multiplexer-inverter according to an embodiment of the present invention are shown in FIG. 11. Wiring tracks of 2-layer metal wiring of a prior-art 4-input multiplexer-inverter are shown in FIG. 2. In the drawing, "x" shows wiring tracks of 2-layer metal wiring used by cells, which means that the tracks cannot be used as wiring tracks of 2-layer metal wiring of one chip.

The length of wiring connected to output circuits located inside multiplexer cells is shorter in a case where the output transistors are arranged in a horizontal row than where the same are arranged in upper and lower cell rows, and wiring capacity can be reduced, therefore, wiring delay inside the cells is reduced.

What is claimed is:

1. A multiplexer cell layout structure comprising:
   cell arrays composed of P-channel transistors and N-channel transistors which are arranged in two upper and lower rows; and
   a wiring layer composed of a plurality of layers for connecting said cell arrays, in which
   each of said cell arrays comprises a plurality of transfer gates, wherein
   a plurality of transistors of said transfer gates are arranged in upper one of said cell arrays and lower one of said cell arrays, and an output terminal of the plurality of arranged transistors is connected across between said upper and lower cell arrays by 2-layer metal wiring of said wiring layer.

2. The multiplexer cell layout structure as set forth in claim 1, wherein said multiplexer has a decoding circuit which has transistors arranged on the upper side and lower side of said cell arrays.

3. The multiplexer cell layout structure as set forth in claim 2, wherein an internal wiring of said decoding circuit is connected across between the upper and lower cell arrays by at least a wiring layer including a polysilicon layer out of said wiring layer, and a control signal wiring for controlling transistor output of said transfer gate circuit is connected across between the upper and lower cell arrays by at least a wiring layer including a polysilicon layer out of said wiring layer.

4. The multiplexer cell layout structure as set forth in claim 2, wherein internal wiring of said decoding circuit is connected by at least one of 1-layer metal wiring and 2-layer metal wiring.

5. The multiplexer cell layout structure as set forth in claim 2, wherein
the control signal wiring for controlling transistor output of said transfer gate circuit is connected by 1-layer metal wiring and 2-layer metal wiring, respectively.

6. The multiplexer cell layout structure as set forth in claim 1, wherein
said multiplexer cells are formed as a 4-input multiplexer-inverter.

7. The multiplexer cell layout structure as set forth in claim 1, wherein
said multiplexer cells are formed as a 3-input multiplexer-inverter.

8. The multiplexer cell layout structure as set forth in claim 1, wherein
said cell arrays are arranged up and down in three rows in place of two upper and lower rows.

9. The multiplexer cell layout structure as set forth in claim 1, wherein
said multiplexer cells are formed as a 5-input multiplexer-inverter.

10. The multiplexer cell layout structure as set forth in claim 1, wherein
said multiplexer cell layout structure is applied to a barrel shifter circuit of a CPU core.

* * * * *